United States Patent [19]
Matsubayashi et al.

[11] Patent Number: 5,675,184
[45] Date of Patent: Oct. 7, 1997

[54] INTEGRATED CIRCUIT DEVICE

[75] Inventors: Hiroto Matsubayashi; Kei Goto; Yoshihiro Notani; Yukio Ohta; Akira Inoue; Yasuharu Nakajima, all of Tokyo, Japan

[73] Assignee: Mitsubishi Denki Kabushiki Kaisha, Tokyo, Japan

[21] Appl. No.: 587,527

[22] Filed: Jan. 17, 1996

[30]       Foreign Application Priority Data

Apr. 5, 1995   [JP]   Japan .................................. 7-080221

[51] Int. Cl.⁶ .................................................. H01L 23/34
[52] U.S. Cl. ........................... 257/728; 257/664; 257/729
[58] Field of Search ..................................... 257/728, 664, 257/723, 724, 729

[56]                 References Cited

U.S. PATENT DOCUMENTS 3,959,874   6/1976   Coucoulas .
5,138,431   8/1992   Huang et al. .
5,469,334   11/1995  Balakrishnan .

*Primary Examiner*—Mahshid D. Saadat
*Assistant Examiner*—S. V. Clark
*Attorney, Agent, or Firm*—Leydig, Voit & Mayer, Ltd.

[57]                 ABSTRACT

An integrated circuit device includes a substrate; circuit elements including an active element and a bias line for applying a DC bias voltage to the active element, disposed on the substrate; a thermoplastic material layer disposed on a region of the substrate; and a magnetic substance layer disposed on a region of the substrate including a region of the bias line, and adhered to and supported by the thermoplastic material layer. In this structure, the magnetic substance layer can be formed in an appropriate shape and at an appropriate position on the bias line according to the oscillation characteristics of the active element, such as a transistor, and the magnetic substance layer absorbs the frequency components of the oscillation of the active element, whereby oscillation of the active element is easily prevented. Further, since the magnetic substance layer is disposed on the bias line, unwanted increase in the chip area of the integrated circuit device due to the use of the prior art oscillation preventing circuit is avoided.

8 Claims, 4 Drawing Sheets

INTEGRATED CIRCUIT DEVICE

FIELD OF THE INVENTION

The present invention relates to a microwave semiconductor integrated circuit device and a method for fabricating the microwave semiconductor integrated circuit.

BACKGROUND OF THE INVENTION

FIG. 7(a) is a plan view illustrating a prior art monolithic microwave semiconductor integrated circuit device. In the figure, reference numeral 1 designates a semiconductor substrate comprising GaAs, Si, or the like, numeral 3 designates via-holes, numeral 4 designates a capacitor comprising a lamination of metal/insulator/metal (hereinafter referred to as MIM capacitor), numeral 7 designates a transistor, such as a field effect transistor, numeral 21 designates an input electrode pad, numeral 22 designates ground electrode pads, numeral 23 designates a gate bias electrode pad, numeral 24 designates a drain bias electrode pad, numerals 51 and 52 designate signal transmission lines, numeral 61 designates a gate side bias line, and numeral 62 designates a drain side bias line.

In this integrated circuit device, a microwave signal applied to the input electrode pad 21 is transmitted through the MIM capacitor 4 and the signal transmission line 51 to the gate of the transistor 7. An output signal from the drain of the transistor 7 is transmitted through the signal transmission line 52 to a subsequent stage circuit (not shown). On the other hand, a gate bias voltage applied to the gate bias electrode pad 23 is transmitted through the gate side bias line 61 and the signal transmission line 51 to the gate of the transistor 7, and a drain bias voltage applied to the drain bias electrode pad 24 is transmitted through the drain side bias line 62 and the signal transmission line 52 to the drain of the transistor 7. The via-holes 3 connect the ground electrode pads 22 to a metal layer (not shown) on the rear surface of the semiconductor substrate 1. The MIM capacitor 4 connected between the input electrode pad 21 and the gate of the transistor 7 passes microwave signals and blocks DC signals.

The above-described prior art semiconductor IC has a problem that the transistor easily oscillates upon the application of the gate and drain bias voltages. In order to prevent this unwanted oscillation, as shown in FIG. 7(b), an oscillation preventing circuit 11 including an MIM capacitor 41 connected to the bias line 61 is included in the IC device. However, since a plurality of transistors 7 are simultaneously fabricated and the oscillation characteristics of individual transistors vary due to variations in the transistor fabricating process, in order to prevent the unwanted oscillation of each transistor 7, it is necessary for the MIM capacitors 41 of the oscillation preventing circuits 11 corresponding to the respective transistors 7 to have different capacitances according to the different oscillation characteristics of the transistors 7. However, since the oscillation preventing circuits 11 are fabricated simultaneously with the transistors 7 and the bias lines 61, it is impossible to change the capacitances of the MIM capacitors 41 after the fabrication of the transistors and the bias lines and the evaluation of the oscillation characteristics of the transistors. Therefore, it is impossible to prevent the unwanted oscillations of all transistors with the oscillation preventing circuits 11.

Further, since the oscillation preventing circuit 11 comprises the MIM capacitor 41 disposed on a region of the semiconductor substrate and a wiring connecting the capacitor 41 to the bias line 61 as shown in FIG. 7(b), the chip area of the IC device is unfavorably increased by the area of the oscillation preventing circuit 11.

SUMMARY OF THE INVENTION

It is an object of the present invention to provide an IC device that easily controls oscillation of a transistor and a method of fabricating the IC device.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an integrated circuit device comprises a substrate; circuit elements including an active element and a bias line for applying a DC bias voltage to the active element, disposed on the substrate; a thermoplastic material layer disposed on a region of the substrate; and a magnetic substance layer disposed on a region of the substrate including a required region on the bias line, and adhered to and supported by the thermoplastic material layer. In this structure, the magnetic substance layer can be formed in an appropriate shape and at an appropriate position on the bias line according to the oscillation characteristics of the active element, such as a transistor, and the magnetic substance layer absorbs the frequency components of the oscillation of the active element, whereby the oscillation of the active element is easily prevented. Further, since the magnetic substance layer is disposed on the bias line, the unwanted increase in the chip area of the integrated circuit device due to the use of the prior art oscillation preventing circuit is avoided.

According to a second aspect of the present invention, in the above-described integrated circuit device, the thermoplastic material layer is disposed on two regions of the substrate which are opposed each other with the bias line between them, and the magnetic substance layer is disposed across the bias line and adhered to and supported by the thermoplastic material layer. Therefore, as described above, the oscillation of the active element is easily prevented. Further, the unwanted increase in the chip area of the integrated circuit device due to the use of the prior art oscillation preventing circuit is avoided.

According to a third aspect of the present invention, in the above-described integrated circuit device, the thermoplastic material layer is disposed on a region of the substrate including a required region on the bias line. Therefore, as described above, the oscillation of the active element is easily prevented. Further, the unwanted increase in the chip area of the integrated circuit device due to the use of the prior art oscillation preventing circuit is avoided.

According to a fourth aspect of the present invention, in the above-described integrated circuit device, the thermoplastic material layer comprises a plurality of island portions which are disposed on opposed two regions of the substrate sandwiching the bias line, and the magnetic substance layer is disposed across the bias line and adhered to and supported by the island portions of the thermoplastic material layer. Therefore, as described above, the oscillation of the active element is easily prevented. Further, the unwanted increase in the chip area of the integrated circuit device due to the use of the prior art oscillation preventing circuit is avoided.

According to a fifth aspect of the present invention, a method of fabricating an integrated semiconductor device comprises fabricating circuit elements including an active element and a bias line for applying a DC bias voltage to the active element on a substrate; forming a thermoplastic material layer on a region of the substrate; and forming a magnetic substance layer on a region of the substrate including a required region on the bias line by applying a magnetic substance to the thermoplastic material layer and heating the magnetic substance and the thermoplastic material layer to adhere the magnetic substance to the thermoplastic material layer. Since the magnetic substance layer absorbs the frequency components of the oscillation of the active element, the oscillation of the active element is prevented. Further, since the magnetic substance layer is formed on the bias line, the unwanted increase in the chip area of the integrated circuit device due to the use of the prior art oscillation preventing circuit is avoided.

According to a sixth aspect of the present invention, in the above-described method, after the fabrication of the circuit elements, the oscillation characteristics of the active element is evaluated by applying a DC bias voltage to the active element, and after the evaluation of the oscillation characteristics, the magnetic substance layer is formed in an appropriate shape and on an appropriate position according to the oscillation characteristics of the active element. Therefore, the oscillation of the active element is easily prevented. Further, since the magnetic substance layer is formed on the bias line, the unwanted increase in the chip area of the integrated circuit device due to the use of the prior art oscillation preventing circuit is avoided.

According to a seventh aspect of the present invention, in the above-described method, the thermoplastic material layer is formed on two regions of the substrate which are opposed each other with the bias line between them, and the magnetic substance layer is formed across the bias line by applying a magnetic substance to the thermoplastic material layer and heating the magnetic substance and the thermoplastic material layer to adhere the magnetic substance to the thermoplastic material layer. Therefore, after evaluating the oscillation characteristics of the active element, the magnetic substance layer can be formed in an appropriate shape and at an appropriate position on the bias line so that the oscillation of the active element is stopped. Further, the unwanted increase in the chip area of the integrated circuit device due to the use of the prior art oscillation preventing circuit is avoided.

According to an eighth aspect of the present invention, in the above-described method, the thermoplastic material layer is formed on a region of the substrate including a required region on the bias line. Therefore, after evaluating the oscillation characteristics of the active element, the magnetic substance layer can be formed in an appropriate shape and at an appropriate position on the bias line so that the oscillation of the active element is stopped. Further, the unwanted increase in the chip area of the integrated circuit device due to the use of the prior art oscillation preventing circuit is avoided.

According to a ninth aspect of the present invention, a plurality of island patterns of thermoplastic material are formed on two regions of the substrate which are opposed each other with the bias line between them, and the magnetic substance layer is formed across the bias line by applying a magnetic substance to the island patterns of thermoplastic material and heating the magnetic substance and the island patterns to adhere the magnetic substance to the island patterns. Therefore, after evaluating the oscillation characteristics of the active element, the magnetic substance layer can be formed in an appropriate shape and at an appropriate position on the bias line so that the oscillation of the active element is stopped. Further, the unwanted increase in the chip area of the integrated circuit device due to the use of the prior art oscillation preventing circuit is avoided.

DETAILED DESCRIPTION OF THE PREFERRED EMBODIMENTS

Embodiment 1

Figure 1:
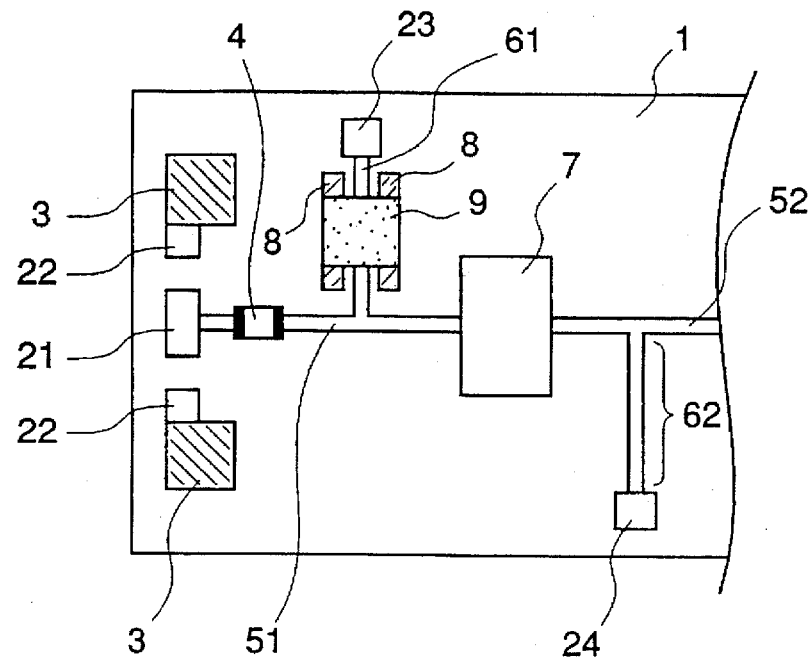
FIG. 1 is a plan view illustrating a semiconductor IC device in accordance with a first embodiment of the present invention.

FIG. 1 is a plan view illustrating a monolithic microwave semiconductor IC device in accordance with a first embodiment of the present invention. In FIG. 1, the same reference numerals as those in FIG. 7(a) designate the same or corresponding parts. Reference numeral 8 designates thermoplastic polyimide layers and reference numeral 9 designates a magnetic substance layer.

In the IC device shown in FIG. 1, a microwave signal applied to the input electrode pad 21 is transmitted through the MIM capacitor 4 and the signal transmission line 51 to the gate of the transistor 7. An output signal from the drain of the transistor 7 is transmitted through the signal transmission line 52 to a subsequent stage circuit (not shown). On the other hand, a gate bias voltage applied to the gate bias electrode pad 23 is transmitted through the gate side bias line 61 and the signal transmission line 51 to the gate of the transistor 7, and a drain bias voltage applied to the drain bias electrode pad 24 is transmitted through the drain side bias line 62 and the signal transmission line 52 to the drain of the transistor 7. The via-holes 3 connect the ground electrode pads 22 to a metal layer (not shown) on the rear surface of the semiconductor substrate 1. The MIM capacitor 4 connected between the input electrode pad 21 and the gate of the transistor 7 passes microwave signals and blocks DC signals. The thermoplastic polyimide layers 8 are located on both sides of the gate side bias line 61. The magnetic substance layer 9 is adhered to the thermoplastic polyimide layers 8 across the gate side bias line 61, whereby the magnetic substance layer 9 is fixed to the semiconductor substrate 1. The magnetic substance layer 9 comprises thermoplastic polyimide containing ferrite grains, or ferrite in the shape of a plate or beads.

Figure 2:
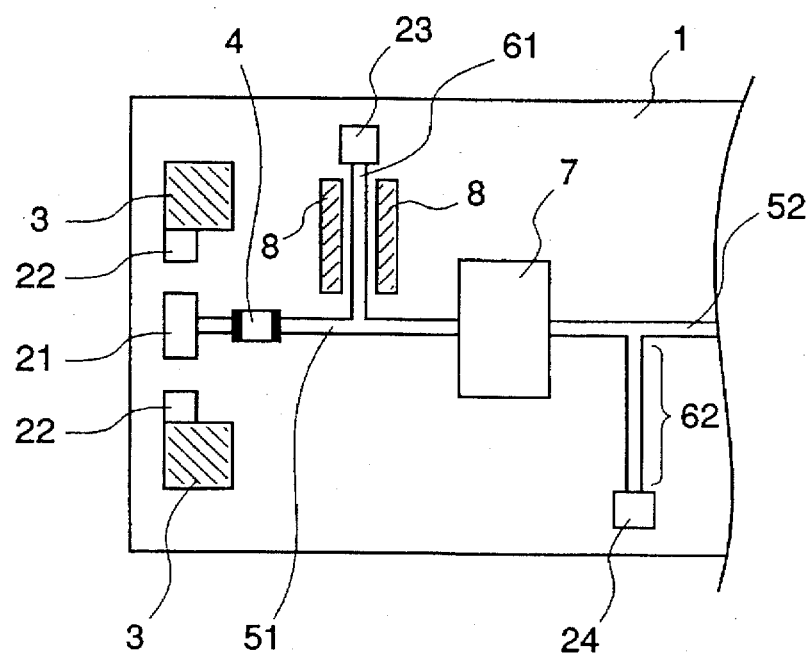
FIG. 2 is a plan view illustrating a process steps in a method of fabricating the semiconductor IC device in accordance with the first embodiment of the present invention.

A description is given of the method for fabricating the IC device shown in FIG. 1. FIG. 2 is a plan view illustrating a process step in the fabricating method. In FIG. 2, the same reference numerals as in FIG. 1 designate the same or corresponding parts.

Initially, the via-holes 3, the MIM capacitor 4, the transistor 7, the electrode pads 21 to 24, the signal transmission lines 51 and 52, and the bias lines 61 and 62 are fabricated on the semiconductor substrate 1. Thereafter, the thermoplastic polyimide layers 8 are formed on the semiconductor substrate 1 at both sides of the bias line 61 as shown in FIG. 2. Then, a DC bias voltage is applied to the gate and the drain of the transistor 7 to evaluate the oscillation characteristics of the transistor 7. If the transistor 7 oscillates, a magnetic substance, which comprises thermoplastic polyimide containing ferrite grains, or ferrite in the shape of a plate or a bead is pressed onto the thermoplastic polyimide layers 8, and heated to adhere the magnetic substance to the polyimide layers 8, whereby the magnetic substance is fixed to the semiconductor substrate 1. In this way, the IC device shown in FIG. 1 on which the magnetic substance layer 9 for preventing oscillation of the transistor 7 is disposed across the gate side bias line 61 is fabricated. If it is confirmed in the evaluation of the oscillation characteristics of the transistor that the transistor does not oscillate, it is not necessary to apply the magnetic substance.

Figure 7:
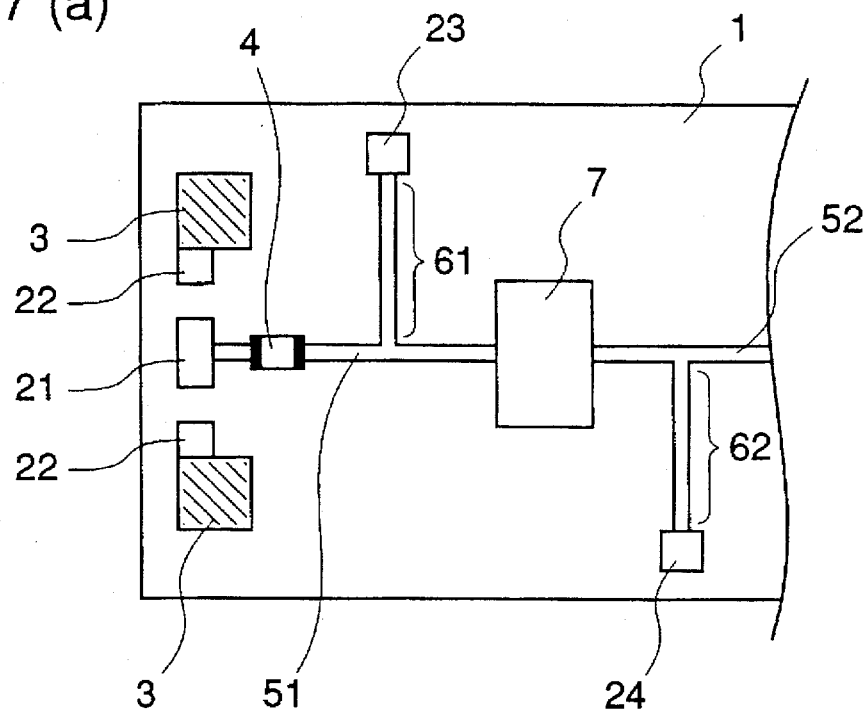
FIGS. 7(a) and 7(b) are plan views illustrating a semiconductor IC device and a semiconductor IC device including an oscillation preventing circuit in accordance with the prior art.
Figure 7:
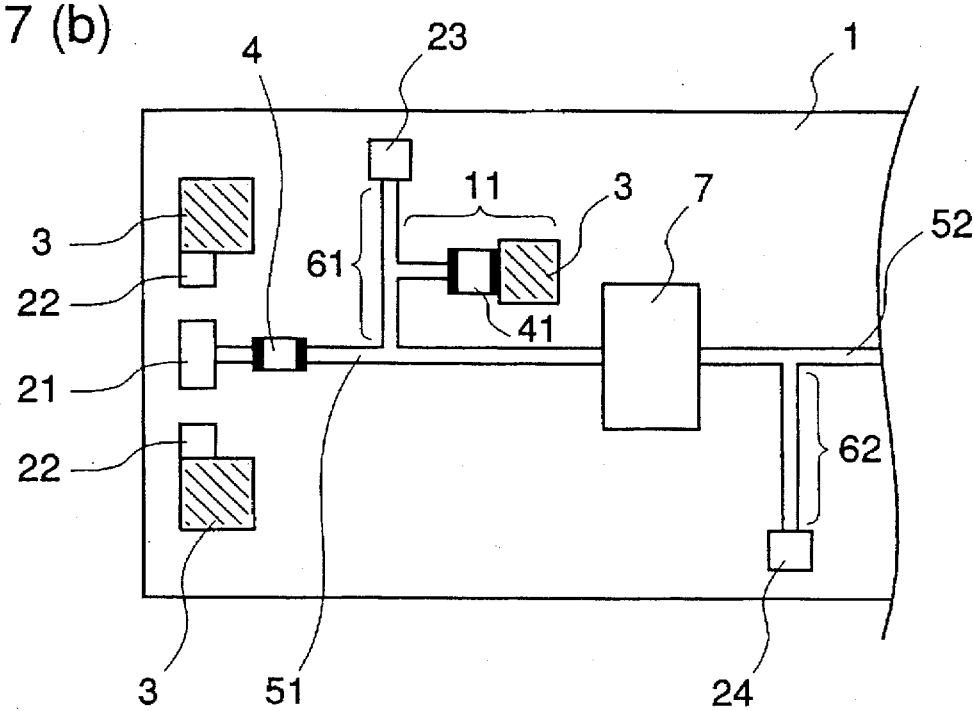

In this first embodiment of the invention, since frequency components of the oscillation of the transistor 7 to which the DC bias voltage is applied are absorbed by the magnetic substance layer 9, oscillation of the transistor 7 is prevented. Further, after the fabrication of the circuit elements, i.e., the transistor 7, the bias lines 61 and 62, the signal transmission lines 51 and 52, and the like on the semiconductor substrate 1, the transistor 7 is operated to evaluate the oscillation characteristics and, thereafter, the magnetic substance layer 9 is formed across the gate side bias line 61. Therefore, the shape and the position of the magnetic substance layer 9 can be appropriately selected according to the oscillation characteristics of the transistor 7, so that the oscillation of any transistor can be easily prevented. Furthermore, the magnetic substance layer 9 is disposed on the bias line 61, and the thermoplastic polyimide layers 8 for fixing the magnetic substance to the semiconductor substrate 1 are disposed on the minimum area regions required for fixing the magnetic substance layer 9 at both sides of the bias line. Therefore, an undesired increase in the chip area of the IC device due to the use of the prior art oscillation preventing circuit 11 shown in FIG. 7(b) is avoided.

Although the magnetic substance layer 9 is disposed on the gate side bias line 61, it may be disposed on the drain side bias line 62 or on both of these bias lines. Alternatively, a plurality of magnetic substance layers may be adhered to the thermoplastic polyimide layers 8.

Embodiment 2

Figure 3:
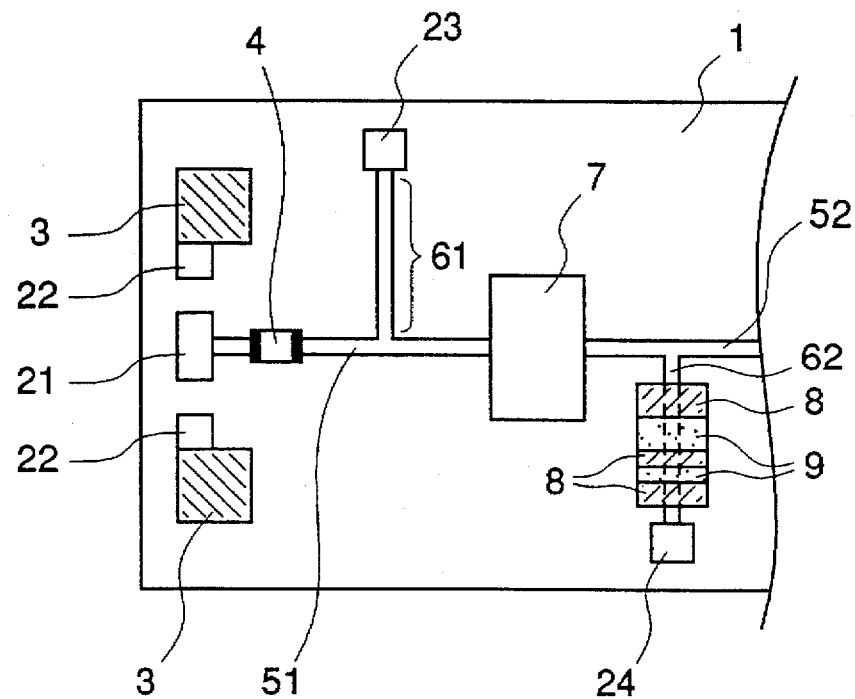
FIG. 3 is a plan view illustrating a semiconductor IC device in accordance with a second embodiment of the present invention.

FIG. 3 is a plan view illustrating a monolithic microwave semiconductor IC device in accordance with a second embodiment of the present invention. In FIG. 3, the same reference numerals as those in FIG. 1 designate the same or corresponding parts.

In the IC device shown in FIG. 3, the microwave signal transmission path and the DC bias voltage application path are the same as those already described in the first embodiment. The thermoplastic polyimide layer 8 is disposed on the drain side bias line 62, and two magnetic substance layers 9 comprising thermoplastic polyimide containing ferrite grains, or ferrite in the shape of a plate or a bead are disposed on the thermoplastic polyimide layer 8. The magnetic substance layers 9 are adhered to the thermoplastic polyimide layer 8, whereby the magnetic substance layers 9 are fixed to the semiconductor substrate 1. Although in the above-described first embodiment the thermoplastic polyimide layer 8 is not present on the bias line, in this second embodiment it is disposed across the bias line.

Figure 4:
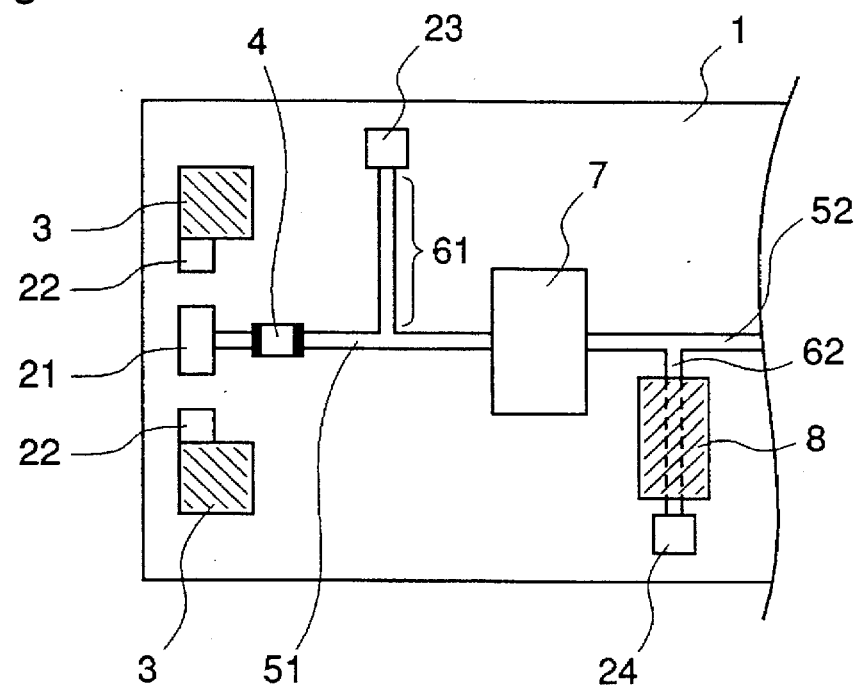
FIG. 4 is a plan view illustrating a process step in a method of fabricating the semiconductor IC device in accordance with the second embodiment of the present invention.

A description is given of the method for fabricating the IC device shown in FIG. 3. FIG. 4 is a plan view illustrating a process step in the fabricating method. In FIG. 4, the same reference numerals as in FIG. 3 designate the same or corresponding parts.

Initially, the via-holes 3, the MIM capacitor 4, the transistor 7, the electrode pads 21 to 24, the signal transmission lines 51 and 52, and the bias lines 61 and 62 are fabricated on the semiconductor substrate 1. Thereafter, the thermoplastic polyimide layer 8 is formed on the semiconductor substrate 1 across the bias line 62 as shown in FIG. 4. Then, a DC bias voltage is applied to the gate and the drain of the transistor 7 to evaluate the oscillation characteristics of the transistor 7. If the transistor 7 is oscillating, the magnetic substance, which comprises thermoplastic polyimide containing ferrite grains, or ferrite in the shape of plates or beads, is pressed onto the thermoplastic polyimide layer 8, and heated to adhere the magnetic substance to the polyimide layer 8, whereby the magnetic substance is fixed to the semiconductor substrate 1. In this way, the IC device shown in FIG. 3 on which the magnetic substance layers 9 for preventing oscillation of the transistor 7 are disposed across the drain side bias line 62 is fabricated. If it is confirmed in the evaluation of the oscillation characteristics of the transistor that the transistor does not oscillate, it is not necessary to use the magnetic substance layers 9.

In this second embodiment of the invention, as in the first embodiment, since the frequency components of the oscillation of the transistor 7 are absorbed by the magnetic substance layers 9, oscillation of the transistor 7 is prevented. Further, since the magnetic substance layers 9 are formed on the drain side bias line 62 after the evaluation of the oscillation characteristics of the transistor 7, the shape and the position of the magnetic substance layers 9 can be appropriately selected according to the oscillation characteristics of the transistor 7. Therefore, it is possible to prevent the oscillation of any transistor. Further, the magnetic substance layers 9 are disposed on the bias line 62, and the thermoplastic polyimide layer 8 is disposed on the minimum area region, including a region of the bias line 62, required for fixing the magnetic substance layers 9. Therefore, an undesired increase in the chip area of the IC device due to the use of the prior art oscillation preventing circuit 11 shown in FIG. 7(b) is avoided.

Although the magnetic substance layer 9 is disposed on the drain side bias line 62, it may be disposed on the gate side bias line 61 or on both of these bias lines. Alternatively, the magnetic substance and the thermoplastic polyimide layer according to this second embodiment may be disposed on one of the bias lines 61 and 62 while the magnetic substance and the thermoplastic polyimide layer according to the first embodiment are disposed on the other bias line.

Although two magnetic substance layers are adhered to the thermoplastic polyimide layer 8, a single magnetic substance layer or three or more magnetic substance layers may be adhered.

Embodiment 3

Figure 5:
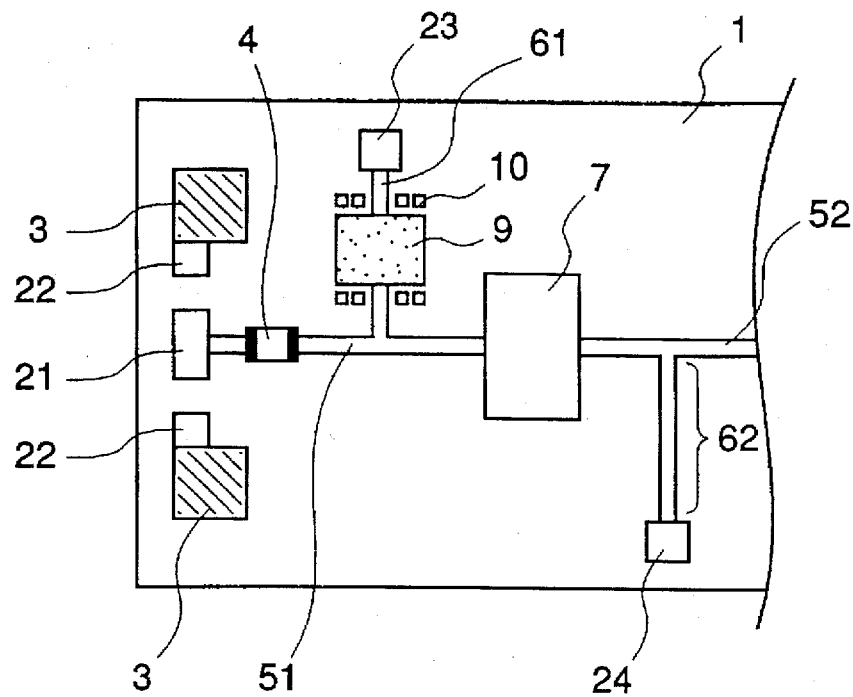
FIG. 5 is a plan view illustrating a semiconductor IC device in accordance with a third embodiment of the present invention.

FIG. 5 is a plan view illustrating a monolithic microwave semiconductor IC device in accordance with a third embodiment of the present invention. In the figure, the same reference numerals as those in FIG. 1 designate the same or corresponding parts. Reference numeral 10 designates island patterns of thermoplastic polyimide (hereinafter referred to as thermoplastic polyimide patterns).

In the IC device shown in FIG. 5, the microwave signal transmission path and the DC bias voltage application path are the same as those already described for the first embodiment. The thermoplastic polyimide patterns 10 are disposed on the semiconductor substrate 1 at both sides of the gate side bias line 61. The magnetic substance layer 9 comprising thermoplastic polyimide containing ferrite grains, or ferrite in the shape of a plate or a bead is disposed across the bias line 61 and adhered to the thermoplastic polyimide patterns 10, whereby it is fixed to the semiconductor substrate 1. While in the first and second embodiments a plate-shaped thermoplastic polyimide layer is employed, in this third embodiment a plurality of island patterns of thermoplastic polyimide are employed.

Figure 6:
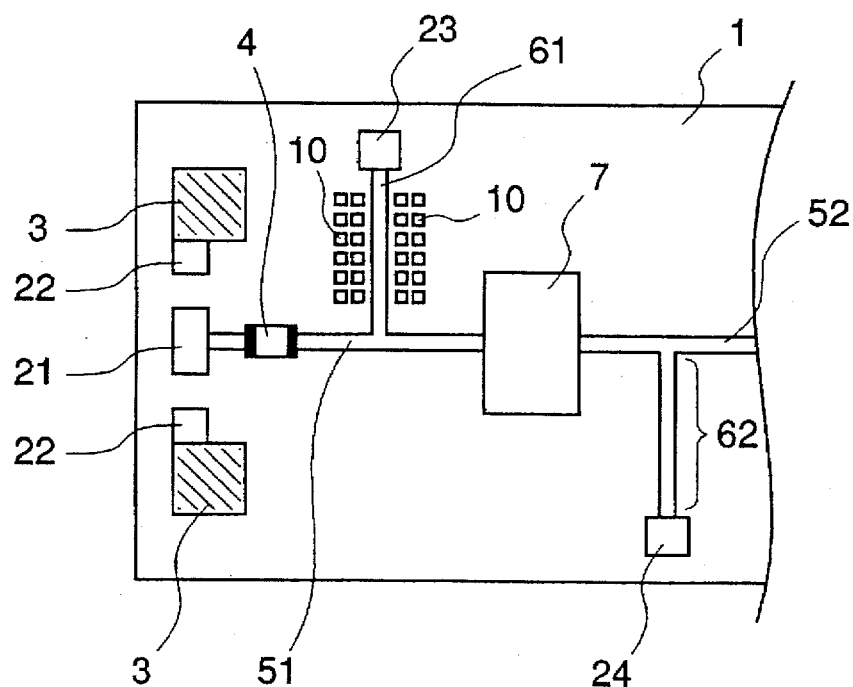
FIG. 6 is a plan view illustrating a process step in a method of fabricating the semiconductor IC device in accordance with the third embodiment of the present invention.

A description is given of the method for fabricating the IC device shown in FIG. 5. FIG. 6 is a plan view illustrating a process step in the fabricating method. In FIG. 6, the same reference numerals as in FIG. 5 designate the same or corresponding parts.

Initially, the via-holes 3, the MIM capacitor 4, the transistor 7, the electrode pads 21 to 24, the signal transmission lines 51 and 52, and the bias lines 61 and 62 are fabricated on the semiconductor substrate 1. Thereafter, the thermoplastic polyimide patterns 10 are formed on the semiconductor substrate 1 at the both sides of the bias line 61 as shown in FIG. 6. Then, a DC bias voltage is applied to the gate and the drain of the transistor 7 to evaluate the oscillation characteristics of the transistor 7. If the transistor 7 is oscillating, the magnetic substance, which comprises thermoplastic polyimide containing ferrite grains, or ferrite in the shape of a plate or a bead, is pressed onto the thermoplastic polyimide patterns 10, and heated to adhere the magnetic substance to the polyimide patterns 10, whereby the magnetic substance is fixed to the semiconductor substrate 1. In this way, the IC device shown in FIG. 5 on which the magnetic substance layer 9 for preventing oscillation of the transistor 7 is disposed across the drain side bias line 62 is fabricated. If it is confirmed in the evaluation of the oscillation characteristics of the transistor that the transistor does not oscillate, it is not necessary to produce the magnetic substance layer 9.

Also in this third embodiment of the invention, as in the first and second embodiments, since the frequency components of the oscillation of the transistor 7 are absorbed by the magnetic substance layer 9, oscillation of the transistor 7 is prevented. Further, since the magnetic substance layer 9 is formed on the gate side bias line 61 after the evaluation of the oscillation characteristics of the transistor 7, the shape and the position of the magnetic substance layer 9 can be appropriately selected according to the oscillation characteristics of the transistor 7. Therefore, it is possible to prevent the oscillation of any transistor. Further, the magnetic substance layer 9 is disposed on the bias line 61, and the thermoplastic polyimide patterns 10 are disposed on the minimum area regions required for fixing the magnetic substance layer 9 at both sides of the bias line 61. Therefore, an undesired increase in the chip area of the IC device due to the use of the prior art oscillation preventing circuit 11 shown in FIG. 7(b) is avoided.

Although the magnetic substance layer 9 is disposed on the gate side bias line 61, it may be disposed on the drain side bias line 62 or on both of these bias lines. Alternatively, the magnetic substance and the thermoplastic polyimide patterns according to this embodiment may be disposed on one of the bias lines 61 and 62 while the magnetic substance and the thermoplastic polyimide layer according to the first or second embodiment are disposed on the other bias line.

Although a single magnetic substance layer is adhered to the thermoplastic polyimide patterns 10, a plurality of magnetic substance layers may be adhered.

What is claimed is:

1. An integrated circuit device comprising:

a substrate;

circuit elements including an active element and a bias line for applying a DC bias voltage to the active element, disposed on the substrate;

a thermoplastic material layer disposed on a region of the substrate; and a magnetic substance layer disposed on a region of the substrate including a region of the bias line, the magnetic substance layer being adhered to and supported by the thermoplastic material layer.

2. The integrated circuit device of claim 1 wherein:

the thermoplastic material layer is disposed on two regions of the substrate which are opposed to each other with the bias line between them; and the magnetic substance layer is disposed across the bias line and adhered to and supported by the thermoplastic material layer.

3. The integrated circuit device of claim 1 wherein:

the thermoplastic material layer is disposed on a region of the substrate including a region of the bias line.

4. The integrated circuit device of claim 1 wherein:

the thermoplastic material layer comprises a plurality of island portions, the island portions being disposed on two regions of the substrate which are opposed to each other with the bias line between them; and the magnetic substance layer is disposed across the bias line and adhered to and supported by the island portions of the thermoplastic material layer.

5. The integrated circuit device of claim 1 wherein the thermoplastic material layer comprises thermoplastic polyimide.

6. The integrated circuit device of claim 1 wherein the magnetic substance layer comprises a thermoplastic material containing ferrite grains.

7. The integrated circuit device of claim 1 wherein the magnetic substance layer comprises ferrite.

8. The integrated circuit device of claim 1 wherein the integrated circuit device is a monolithic semiconductor integrated circuit device.

* * * * *